United States Patent
Kasahara

(10) Patent No.: US 10,230,143 B2
(45) Date of Patent: Mar. 12, 2019

(54) STRUCTURE AND WIRING SUBSTRATE

(71) Applicant: NEC Corporation, Tokyo (JP)

(72) Inventor: Yoshiaki Kasahara, Tokyo (JP)

(73) Assignee: NEC CORPORATION, Tokyo (JP)

( * ) Notice: Subject to any disclaimer, the term of this patent is extended or adjusted under 35 U.S.C. 154(b) by 28 days.

(21) Appl. No.: 15/546,301

(22) PCT Filed: Jan. 5, 2016

(86) PCT No.: PCT/JP2016/000019
§ 371 (c)(1),
(2) Date: Jul. 26, 2017

(87) PCT Pub. No.: WO2016/129200
PCT Pub. Date: Aug. 18, 2016

(65) Prior Publication Data
US 2018/0026322 A1    Jan. 25, 2018

(30) Foreign Application Priority Data
Feb. 12, 2015    (JP) .................... 2015-025091

(51) Int. Cl.
*H05K 1/16*    (2006.01)
*H01P 1/20*    (2006.01)
*H05K 1/02*    (2006.01)

(52) U.S. Cl.
CPC .......... *H01P 1/2005* (2013.01); *H05K 1/02* (2013.01); *H05K 1/16* (2013.01)

(58) Field of Classification Search
CPC ................................ H01P 1/2005; H05K 1/16
USPC ............................ 333/12, 167, 168, 185, 208
See application file for complete search history.

(56) References Cited

U.S. PATENT DOCUMENTS

| | | | |
|---|---|---|---|
| 7,215,007 B2 | 5/2007 | McKinzie, III et al. |
| 2007/0090398 A1 | 4/2007 | McKinzie, III |
| 2007/0176827 A1 | 8/2007 | Itoh et al. |
| 2009/0315648 A1 | 12/2009 | Toyao |
| 2012/0032865 A1 | 2/2012 | Toyao et al. |

(Continued)

FOREIGN PATENT DOCUMENTS

| | | |
|---|---|---|
| EP | 2 221 923 A1 | 8/2010 |
| JP | 2010-010183 A | 1/2010 |

(Continued)

OTHER PUBLICATIONS

International Search Report of PCT/JP2016/000019 dated Mar. 29, 2016.

*Primary Examiner* — Stephen E. Jones
(74) *Attorney, Agent, or Firm* — Sughrue Mion, PLLC

(57) ABSTRACT

Provided is a structure including at least: a first conductor plane; a second conductor plane disposed so as to face the first conductor plane; a first transmission line that is formed in a layer different from the first conductor plane and the second conductor plane and is disposed so as to face the second conductor plane, one end of the first transmission line being an open end; a conductor via that connects another end of the first transmission line with the first conductor plane; a slit that is formed on the second conductor plane and stretches to both sides of the first transmission line from a starting point where the slit overlaps the first transmission line in a plan view. Thus, a structure that enables formation of a compact EBG structure is provided.

10 Claims, 18 Drawing Sheets

(56) References Cited

U.S. PATENT DOCUMENTS

| | | | |
|---|---|---|---|
| 2012/0119969 A1* | 5/2012 | MacDonald | H01L 23/552 343/841 |
| 2013/0107491 A1 | 5/2013 | Imazato et al. | |
| 2014/0028412 A1 | 1/2014 | Sasaki et al. | |
| 2018/0013187 A1* | 1/2018 | Kasahara | H01P 1/16 |

FOREIGN PATENT DOCUMENTS

| | | |
|---|---|---|
| JP | 2010-199881 A | 9/2010 |
| JP | 2013-255259 A | 12/2013 |
| WO | 2013/168377 A1 | 11/2013 |

\* cited by examiner

STRUCTURE AND WIRING SUBSTRATE

CROSS REFERENCE TO RELATED APPLICATIONS

This application is a National Stage of International Application No. PCT/JP2016/000019 filed Jan. 5, 2016, claiming priority based on Japanese Patent Application No. 2015-025091 filed Feb. 12, 2015, the contents of all of which are incorporated herein by reference in their entirety.

TECHNICAL FIELD

The present invention relates to a structure and a wiring substrate.

BACKGROUND ART

In an electronic device in which a plurality of conductor planes are present, for example, a current flowing into a circuit during switching of a digital circuit induces a magnetic field and a voltage fluctuation caused during switching induces an electric field, so that electromagnetic waves are generated. The electromagnetic waves become electromagnetic noise propagating through a parallel flat line formed of conductor planes. The electromagnetic noise cause problems such as instability of operation of other circuits and deterioration in radio performance of the device. Accordingly, if it is possible to establish a technique for suppressing the electromagnetic noise, the stability of circuits and the radio performance of the device can be improved.

Examples of a conventional technique employed to suppress the electromagnetic noise include a method of disposing a decoupling capacitor between conductor planes. However, the conventional technique has the following problem.

In the case of a technique using a decoupling capacitor, an inevitable parasitic inductance of a capacitor makes it difficult to set a self resonant frequency to a high frequency of several hundred MHz. Accordingly, in general, the technique using a decoupling capacitor can be applied to a frequency of at most about several hundred MHz, while it cannot be applied to a high frequency band used for radio communication in recent years (for example, frequency bands of 2.4 GHz and 5.2 GHz which are used for wireless LAN, and frequency bands of 1.8 GHz, 2.6 GHz, and 3.5 GHz which are used for LTE (Long Term Evolution).

As techniques for solving the above-mentioned problem, techniques using a structure are disclosed in, for example, the Specification of U.S. Pat. No. 7,215,007 (PTL 1), Japanese Unexamined Patent Application Publication No. 2010-199881 (PTL 2), and Japanese Unexamined Patent Application Publication No. 2010-10183 (PTL 3). The structure disclosed in Patent Literature 1, 2, and 3 is a structure having EBG (Electromagnetic Band Gap) characteristics having a dispersion relation with a band gap for inhibiting propagation of electromagnetic waves at a characteristic frequency (this structure is hereinafter referred to as an EBG structure). This structure can suppress propagation of electromagnetic noise between power supply planes. The use of the technique using the EPG structure makes it possible to obtain an effect of suppressing electromagnetic noise in a high frequency band of GHz.

CITATION LIST

Patent Literature

[PTL 1] Specification of U.S. Pat. No. 7,215,007

[PTL 2] Japanese Unexamined Patent Application Publication No. 2010-199881

[PTL 3] Japanese Unexamined Patent Application Publication No. 2010-10183

SUMMARY OF INVENTION

Technical Problem

In recent electronic devices, miniaturization has advanced and wiring substrates have become complicated. Accordingly, the EBG structure, which is a structure for suppressing electromagnetic noise, is preferably as compact as possible. However, the structure disclosed in PTL 1 or the like has a problem that its size is large.

Object of the Present Invention

Therefore, an example object of the present invention is to provide a structure and a wiring substrate which make it possible to provide a compact EBG structure.

Solution to Problem

To solve the above-mentioned problems, a structure and a wiring substrate according to the present invention mainly employ the following characteristic configurations.

(1) A structure according to the present invention includes at least:

a first conductor plane;

a second conductor plane that is disposed so as to face the first conductor plane;

a first transmission line that is formed in a layer different from the first conductor plane and the second conductor plane and is disposed so as to face the second conductor plane, one end of the first transmission line being an open end;

a conductor via that connects another end of the first transmission line with the first conductor plane; and a slit that is formed on the second conductor plane and stretches to both sides of the first transmission line from a starting point where the slit overlaps the first transmission line in a plan view.

(2) A wiring substrate according to the present invention includes a structure including at least:

a first conductor plane;

a second conductor plane that is disposed so as to face the first conductor plane;

a first transmission line that is formed in a layer different from the first conductor plane and the second conductor plane and is disposed so as to face the second conductor plane, one end of the first transmission line being an open end;

a conductor via that connects another end of the first transmission line with the first conductor plane; and a slit that is formed on the second conductor plane and stretches to both sides of the first transmission line from a starting point where the slit overlaps the first transmission line in a plan view.

Advantageous Effects of Invention

A structure and a wiring substrate according to the present invention provide the following example advantageous effects.

That is, according to the present invention, it is possible to achieve an EBG structure that includes first and second conductor planes forming a parallel flat line, and a first transmission line functioning as an open stub at a location facing the second conductor plane, and further includes a slit, as an inductance imparting member, on the second conductor plane that operates as a return path for the first transmission line whose another end is connected with the first conductor plane via a conductor via, thereby achieving a compact EBG structure.

DESCRIPTION OF EMBODIMENTS

Figure 1:
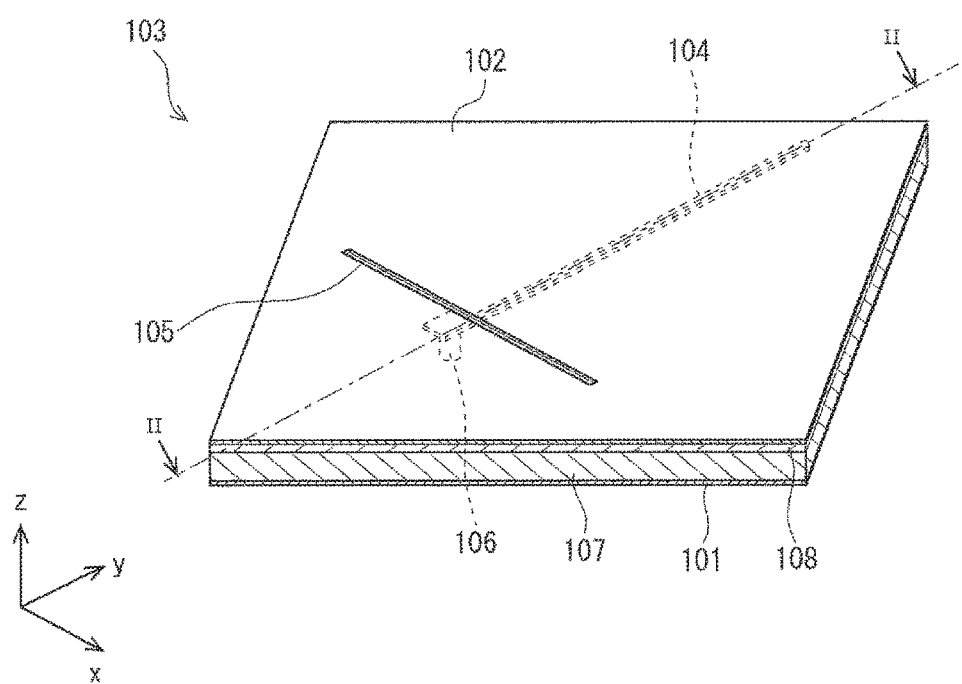
FIG. 1 is a perspective view showing an appearance of a structure according to a first example embodiment of the present invention.

Preferred example embodiments of a substrate and a wiring substrate according to the present invention will be described below with reference to the accompanying drawings. Note that in the drawings, like components are denoted by like reference numerals, and descriptions thereof are omitted as appropriate. Reference numerals in the drawings are assigned to the components by way of example to facilitate understanding of the invention, and are not intended to limit the present invention to modes illustrated in the drawings. Further, in each of the following example embodiments, a substrate thickness direction (i.e., for example, a longitudinal direction or a z-axis direction in FIG. 1) is expressed as being a "thickness direction".

(Features of the Present Invention)

Prior to giving descriptions of example embodiments of the present invention, an outline of features of the present invention will now be given. A main feature of the present invention is to provide a structure including at least: a first conductor plane; a second conductor plane disposed so as to face the first conductor plane; a first transmission line that is disposed so as to face the second conductor plane, one end of the first transmission line being an open end; a conductor via that connects another end of the first transmission line with the first conductor plane; and a slit that is formed on the second conductor plane and stretches to both sides of the first transmission line from a starting point where the slit overlaps the first transmission line in a plan view. Thus, a compact EBG structure can be achieved.

First Example Embodiment

Configuration Example of First Example Embodiment

Figure 2:
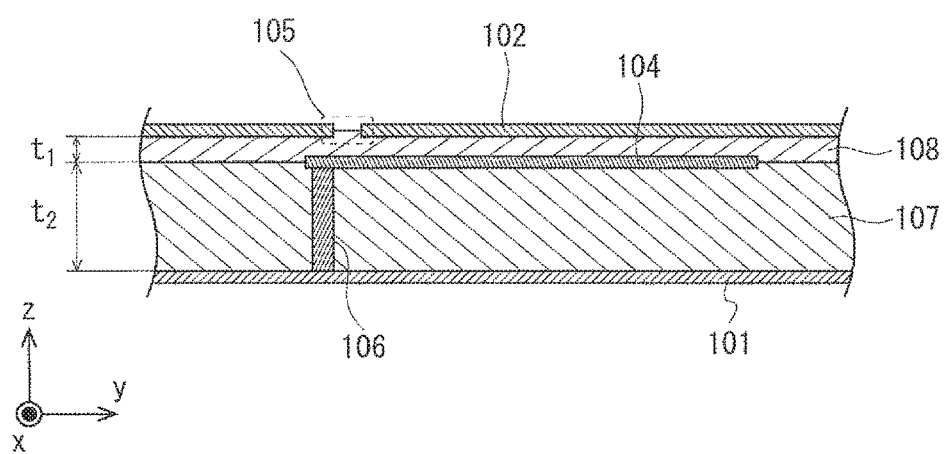
FIG. 2 is a sectional view showing a sectional structure of the structure shown in FIG. 1.

First, a configuration of a structure according to a first example embodiment will be described with reference to FIGS. 1 to 13. FIG. 1 is a perspective view showing an appearance of the structure according to the first example embodiment of the present invention, and illustrates an example of an EBG structure according to the first example embodiment. FIG. 2 is a sectional view showing an example of a sectional structure of the structure shown in FIG. 1. The sectional view of FIG. 2 illustrates a section taken along a line II-II shown in FIG. 1.

As shown in the perspective view of FIG. 1 and the sectional view of FIG. 2, the structure according to the first example embodiment includes at least a first conductor plane 101 (first conductor), a second conductor plane 102 (second conductor), a first transmission line 104, a conductor via 106 (first conductor via), and a slit 105 (inductance imparting member).

The second conductor plane 102 faces the first conductor plane 101. The first transmission line 104 is provided in a region sandwiched between the first conductor plane 101 and the second conductor plane 102, and is formed in a layer different from the first conductor plane 101 and the second conductor plane 102. The first transmission line 104 is disposed so as to face the second conductor plane 102 and stretches linearly in the y-axis direction shown in FIG. 1. One end of the first transmission line 104 is an open end, and the other end thereof is connected with the first conductor plane 101 via the conductor via 106. The first transmission line 104 functions as an open stub. In particular, when the first transmission line 104 is provided between the first conductor plane 101 and the second conductor plane 102, as shown in FIG. 2, a distance $t_1$ between the second conductor plane 102 and the first transmission line 104 is desirably smaller than a distance $t_2$ between the first conductor plane 101 and the first transmission line 104. For example, the distance $t_1$ between the second conductor plane 102 and the first transmission line 104 is desirably equal to or less than a half (½) of the distance $t_2$ between the first conductor plane 101 and the first transmission line 104 ($t_1 \leq (1/2) \times t_2$).

As described above, the conductor via 106 stretches in the z-axis direction (thickness direction) so as to connect the other end of the first transmission line 104 to the first conductor plane 101, and extends from the upper surface of a first dielectric layer 107 to the lower surface thereof. The slit 105 is provided on the second conductor plane 102 and stretches to the both sides of the first transmission line 104 in the x-axis direction, which is perpendicular to the y-axis direction of the first transmission line 104, from a location where the slit 105 overlaps the first transmission line 104 in a plan view, i.e., a starting point where the slit 105 overlaps the other end of the first transmission line 104 in the z-axis direction (thickness direction).

The structure according to the first example embodiment will be described in more detail below. The structure according to the first example embodiment is formed in, for example, a wiring substrate such as a printed wiring board, and behaves as a structure having EBG (Electromagnetic Band Gap) characteristics (hereinafter referred to as an EBG structure). The EBG structure includes a unit structure 103, as described below, which includes at least the first conductor plane 101 and the second conductor plane 102 which are disposed in parallel at an interval in the thickness direction (z-axis direction shown in FIG. 1).

Specifically, the unit structure 103 is a set of components of the structure shown in FIG. 1. As described above with reference to FIG. 1, the unit structure 103 includes the first conductor plane 101 and the second conductor plane 102 and, in addition, at least the first transmission line 104 disposed in a layer different from the first conductor plane 101 and the second conductor plane 102, the slit 105 formed on the second conductor plane 102, and the conductor via 106 that electrically connects the other end of the first transmission line 104 with the first conductor plane 101. As described above, the slit 105 is provided on the second conductor plane 102 and stretches to the both sides of the first transmission line 104 from the starting point where the slit 105 overlaps the first transmission line 104 in the z-axis direction (thickness direction).

In this case, when the length of the slit 105, i.e., the slit length, is represented by L and the transmission line length of the first transmission line 104 is represented by D, in general, the slit length L is desirably twice or less as long as the transmission line length D of the first transmission line 104 ($L \leq 2 \times D$) so that the area occupied by the slit 105 can be reduced. If possible, it is desirable to form the slit 105 so as to overlap the first transmission line 104 in a plan view at least at a location where (L/2−L/4) or more and (L/2+L/4) or less from a slit end of the slit 105 are satisfied. It is further desirable to form the first transmission line 104 so as to overlap the slit 105 in a plan view at least at a location within a range of (D/8) or less from a node between the first transmission line 104 and the conductor via 106. This is because the miniaturization effect obtained by the slit 105, in particular, on a first band gap, can be increased.

The EBG structure illustrated in FIGS. 1 and 2 includes the first dielectric layer 107, which is stacked one side (the upper surface side: the side on which the second conductor plane 102 is formed) of the first conductor plane 101 in the thickness direction between the first conductor plane 101 and the second conductor plane 102, and a second dielectric layer 108 which is stacked on one side (upper surface side) of the first dielectric layer 107 in the thickness direction. Specifically, the first conductor plane 101 is disposed on the other side (lower surface side) of the first dielectric layer 107 in the thickness direction, and the second conductor plane 102 is disposed on one side (upper surface side) of the second dielectric layer 108.

As shown in FIG. 2, the first transmission line 104 is disposed between the other side (lower surface side) of the second dielectric layer 108 in the thickness direction and one side (upper surface side) of the first dielectric layer 107. Further, the slit 105 is provided on the second conductor plane 102 and, as shown in FIGS. 1 and 2, stretches to the both sides of the first transmission line 104 in the x-axis direction, which is perpendicular to the y-axis direction of the first transmission line 104, from the starting point where the slit 105 overlaps the first transmission line 104 in the z-axis direction (thickness direction).

As shown in FIG. 2, the conductor via 106 stretches in the z-axis direction (thickness direction), extends from one side (upper surface side) of the first dielectric layer 107 to the other side (lower surface side) thereof, and electrically connects the other end of the first transmission line 104 to the first conductor plane 101. Note that as shown in FIG. 1, the components described above, i.e., the first conductor plane 101, the second conductor plane 102, the first transmission line 104, the slit 105, and the conductor via 106 constitute the unit structure 103, which makes it possible to repeatedly arrange a large number of unit structures 103.

Figure 3:
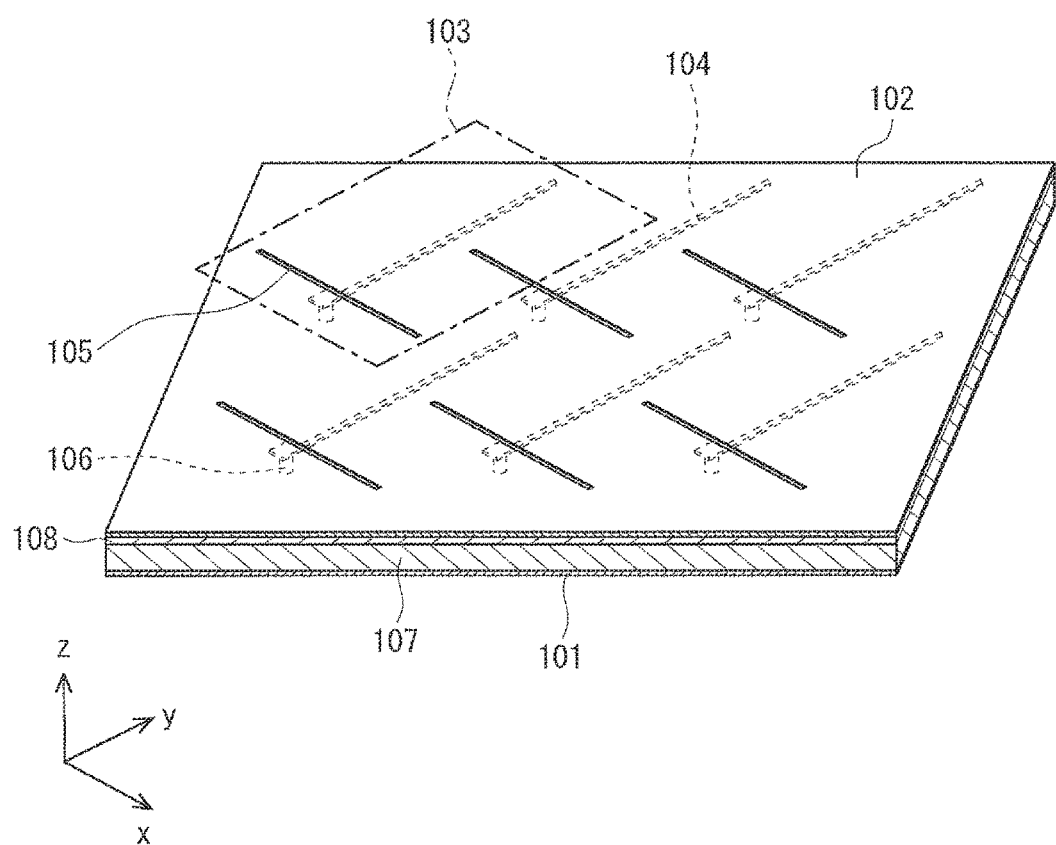
FIG. 3 is a perspective view of the structure according to the first example embodiment when a plurality of structures shown in FIG. 1 are arranged.

A single unit structure 103 like the unit structure 103 shown in FIG. 1 also has a filter effect having electromagnetic noise blocking characteristics. However, as shown in FIG. 3, it is desirable to arrange a large number of unit structures 103 shown in FIG. 1. FIG. 3 is a perspective view showing the structure according to the first example embodiment of the present invention when a plurality of structures shown in FIG. 1 are arranged. A dashed-dotted line indicates the region of the unit structure 103 shown in FIG. 1. Note that in the structure shown in FIG. 3, the unit structures 103 that are regularly arranged are illustrated. However, according to the present invention, the unit structures 103 need not necessarily be arranged regularly as shown in FIG. 3, but instead may be arranged randomly. Further, in the structure shown in FIG. 3, the arrangement of a large number of unit structures 103 having the same shape is illustrated. However, the unit structures 103 need not necessarily have the same shape, and various types of unit structures 103 in which, for example, the first transmission lines 104 have different shapes, or the slits 105 have different shapes, may be arranged.

(Operation Principle of First Example Embodiment)

Next, the basic operation principle of the above-described EBG structure will be described.

Figure 4:
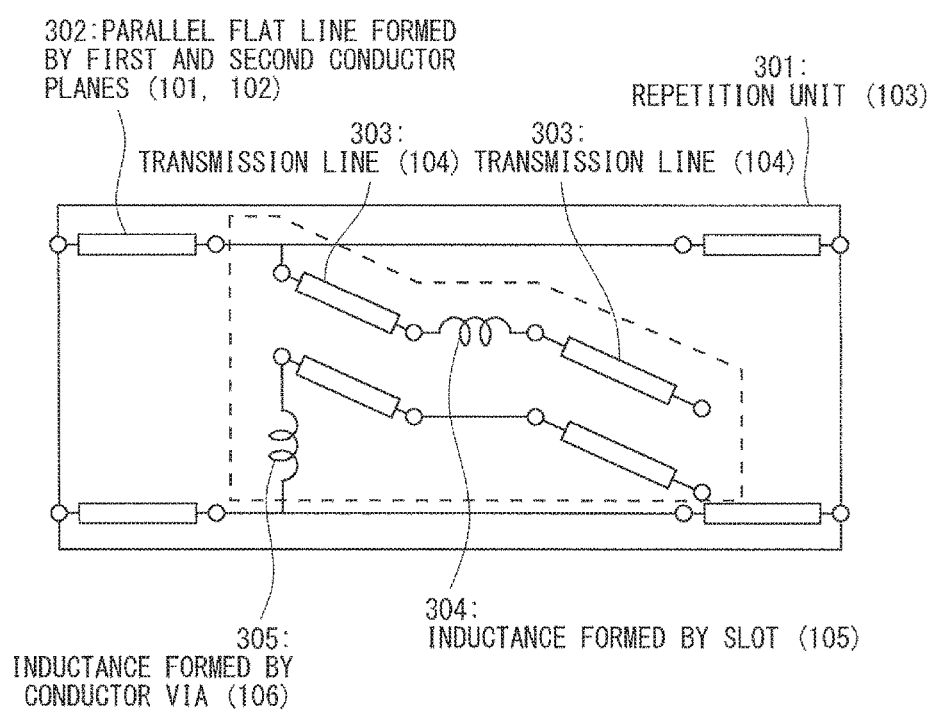
FIG. 4 is a circuit diagram showing an example of an equivalent circuit in a direction along any straight line within an xy plane in the structure shown in FIG. 3 as the first example embodiment.
Figure 5:
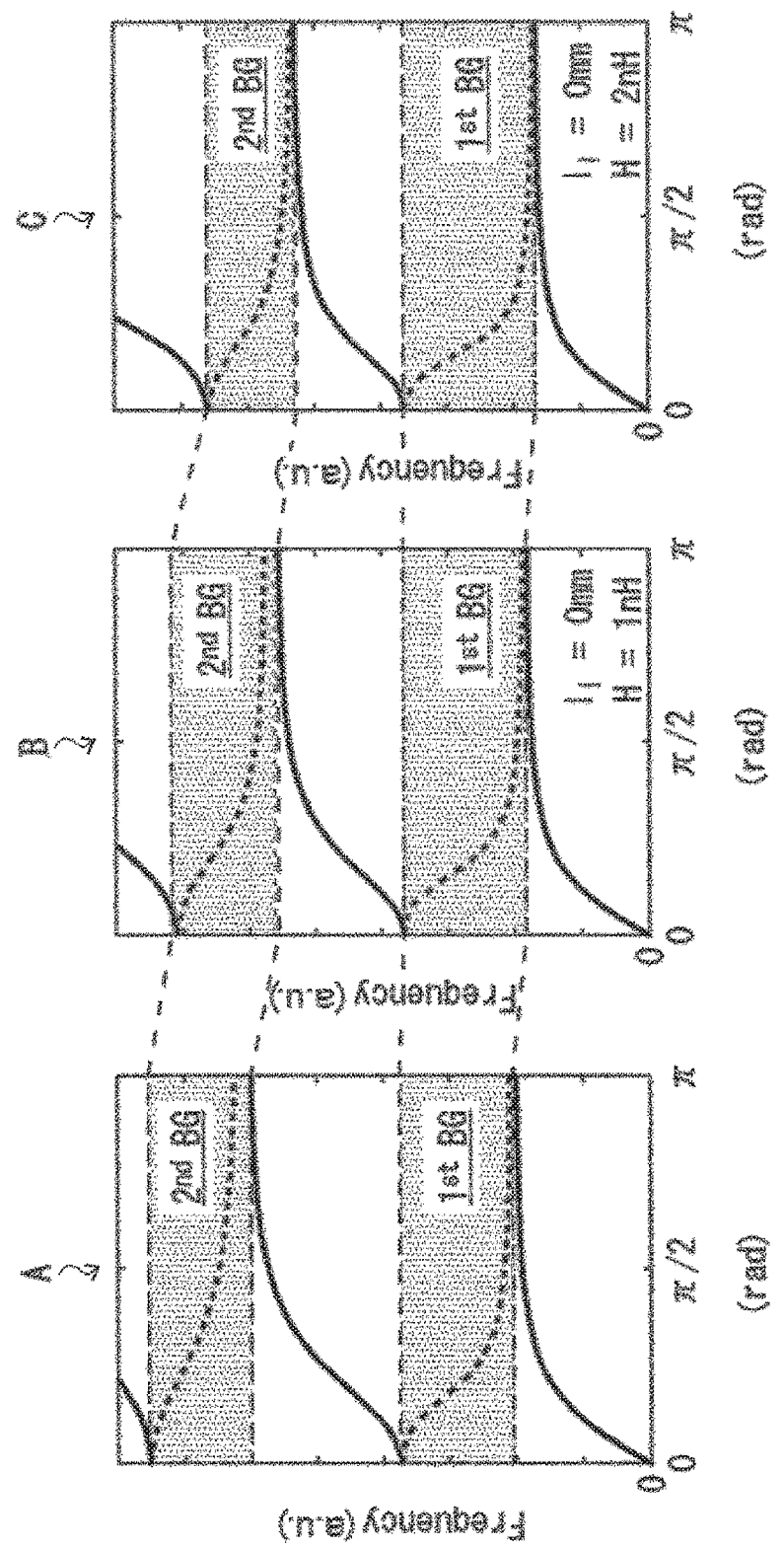
FIG. 5 is an explanatory diagram showing an example of a dispersion relation (a relation between a wavenumber and a frequency) of an EBG structure according to the first example embodiment.

FIG. 4 is a circuit diagram showing an example of an equivalent circuit in a direction along any straight line within an xy plane in the structure shown in FIG. 3 as the first example embodiment, and illustrates an equivalent circuit diagram of the EBG structure according to the first example embodiment. FIG. 5 is an explanatory diagram showing an example of a dispersion relation (a relation between a wavenumber and a frequency) of the EBG structure according to the first example embodiment, and illustrates an effect of the EBG structure according to the first example embodiment.

As shown in FIG. 4, in the equivalent circuit of the structure according to the first example embodiment, a repetition unit 301 corresponding to the unit structure 103 includes a parallel flat line 302, which is formed of the first conductor plane 101 and the second conductor plane 102, a transmission line 303 corresponding to the first transmission line 104 of the open stub, an inductance 304 which is added by the slit 105 and formed in the middle of the first transmission line 104, and an inductance 305 which is added by the conductor via 106. The repetition unit 301 is a single equivalent circuit of the unit structure 103 shown in FIG. 3. Assuming a situation where an infinite number of the structures are periodically arranged, the dispersion relation of the parallel flat line in which the structures according to the first example embodiment are arranged can be calculated.

An inductance added by each slit 105 is derived from a short stub formed by the slit 105. Both portions of the slit 105 extend to the both sides of the first transmission line 104 along the x-axis direction and each portion of the slit 105 behaves as a short stub. Assuming that the length of the short stub is represented by l and the wavelength of a target electromagnetic wave is represented by λ, when the length l of the short stub is equal to or more than $\lambda \times 2(n-1)/4$ and equal to or less than $\lambda \times (2n-1)/4$ (n: natural number), the short stub formed by the slit 105 behaves as an inductance. Accordingly, the structure according to the first example embodiment can be described using the equivalent circuit shown in FIG. 4.

A Bloch periodic boundary condition is applied to an ABCD matrix of the repetition unit 301 that is calculated from the equivalent circuit diagram illustrated in FIG. 4, and the dispersion relation of the parallel flat line in which an infinite number of the unit structures 103 are periodically arranged is calculated, thereby making it possible to calculate a band gap frequency.

FIG. 5 is an explanatory diagram showing an example of a dispersion relation (a relation between a wavenumber and a frequency) of the EBG structure according to the first example embodiment. The dispersion relation is illustrated, the dispersion relation obtained as a result of calculating the dispersion relation of the parallel flat line when an infinite number of the unit structures 103 shown in FIG. 1 are periodically arranged as shown in FIG. 3. In FIG. 5, the vertical axis represents a frequency and the horizontal axis represents a value obtained by multiplying the wavenumber and the repetition unit 301 (unit structure 103), which indicates a degree of rotation of the phase of the electromagnetic wave propagating through each repetition unit (unit structure 103).

"A" in FIG. 5 represents the dispersion relation of the structure when not slit 105 is formed; "B" in FIG. 5 represents the dispersion relation of the structure according to the first example embodiment when the value of 1 nH is used as the value of the inductance 304 which is added by the slit 105; and "C" in FIG. 5 represents the dispersion relation of the structure according to the first example embodiment when the value of 2 nH is used as the value of the inductance added by the slit 105. In the case of calculating the dispersion relation between "B" and "C" shown in FIG. 5, the value of 0 mm is used as the location of the slit 105, i.e., the transmission line length $l_1$ from a part connected with the conductor via 106 to the slit 105.

In order for each slit 105 to effectively operate as an inductance, it is necessary that the electromagnetic wave propagating through the first transmission line 104 excites the slit 105 so that the slit 105 can operate as a slot line. Accordingly, it is necessary to cause a current to flow so that electric charges are induced at both ends of the slit 105 provided on the second conductor plane 102 which has a planar shape and serves as a return path for the first transmission line 104.

Different current standing waves are generated depending on the frequency on the first transmission line 104 and the second conductor plane 102 serving as a return path for the first transmission line 104. For example, in the equivalent circuit illustrated in FIG. 4, when the contribution of the parallel flat line 302 and the contribution of the inductance 305 due to the conductor via 106 are ignored, current standing waves are generated in such a manner that, as indicated by shaded parts in FIG. 5 as band gap frequency bands, the electrical field strength changes to an anti-node and a node in this order in a direction from a part connected with the conductor via 106 to the open end at a lower limit frequency of a first band gap ($1^{st}$ BG). On the other hand, at an upper limit frequency of the first band gap ($1^{st}$ BG), current standing waves are generated in such a manner that the electrical field strength changes to a node, an anti-node, and a node in this order in the direction from the part connected with the conductor via 106 to the open end.

At a lower limit frequency of a second band gap ($2^{nd}$ BG), current standing waves are generated in such a manner that the electrical field strength changes to an anti-node, a node, an anti-node, and a node in this order in the direction from the part connected with the conductor via 106 to the open end. On the other hand, at an upper limit frequency of the second band gap ($2^{nd}$ BG), current standing waves are generated in such a manner that the electrical field strength changes to a node, an anti-node, a node, an anti-node, and a node in this order in the direction from the part connected with the conductor via 106 to the open end.

After that, also for an n-th band gap ($n^{th}$ BG: (n: natural number)), current standing waves including n number of repetitions of anti-node→node of the electrical field strength are generated at a lower limit frequency. At an upper limit frequency of the n-th band gap, current standing waves starting from the node of the electrical field strength and, in addition, including n number of repetitions of anti-node-→node in the direction from the point connected with the conductor via 106 to the open end.

Specifically, when the location where the slit 105 is added is located in the vicinity ($l_1$=0 mm) of the part connected with the conductor via 106, the slit 105 is provided at a location corresponding to the anti-node of the current standing wave generated on the second conductor plane 102 at the lower limit frequency of the n-th band gap ($n^{th}$ BG), thereby enabling the slit 105 to effectively operate as an inductance.

Further, as shown in FIG. 4, the addition of the inductance at a series part of an equivalent circuit model of the first transmission line 104 indicates that the electrical length of the first transmission line 104 is extended. In the structure according to the first example embodiment, the band gap frequency is determined by the electrical length of the first transmission line 104. In other words, the band gap frequency can be lowered by adding the inductance 304 by the slit 105. This indicates that when the structure including the slit 105 is compared with the structure including no slit 105, the band gap frequency with the same frequency can be achieved with a shorter transmission line length, i.e., a smaller structure.

Based on the event as described above, the location where the slit 105 is added is located in the vicinity ($l_1=0$ mm) of the part connected with the conductor via 106, so that the slit 105 operates as an inductance at the lower limit frequency of the n-th band gap ($n^{th}$ BG) and also operates to lower the lower limit frequency of the band gap. In this case, at the upper limit frequency of the n-th band gap ($n^{th}$ BG), as described above, the vicinity ($l_1=0$ mm) of the part connected with the conductor via 106 corresponds to the location of the node of the current standing wave, and thus the contribution of the inductance to the upper limit frequency of the band gap is not large. Thus, the effect of widening the band gap width can be obtained at the same time.

The event described above can be easily understood from explanatory diagrams A, B, and C of FIG. 5. In the case of B in FIG. 5 illustrating a case where an inductance value H which is added by the slit 105 is 1 nH, the lower limit frequency of the first band gap ($1^{st}$ BG) is lowered as compared with the case of A in FIG. 5 in which no slit is formed. In the case of C in FIG. 5 illustrating that the inductance value H added by the slit 105 is increased to 2 nH, the lower limit frequency of the first band gap ($1^{st}$ BG) is lowered. On the other hand, the upper limit frequency of the first band gap ($1^{st}$ BG) in each of A, B, and C in FIG. 5 is substantially the same.

The lower limit frequency of the second band gap ($2^{nd}$ BG) is also lowered as the value of the added inductance in each of A, B, and C in FIG. 5 increases in this order. On the other hand, the upper limit frequency of the second band gap ($2^{nd}$ BG) is also lowered as the value of the added inductance in A, B, and C in FIG. 5 increases in this order.

In the above description about the presence of current standing waves, the contribution of the parallel flat line 302 and the contribution of the inductance 305 due to the conductor via 106 are ignored. However, in the case of actually calculating the dispersion relation shown in FIG. 5, the contribution of the parallel flat line 302 and the contribution of the inductance 305 due to the conductor via 106 are taken into consideration. Accordingly, even when $l_1=0$ mm at the upper limit frequency of the second band gap ($2^{nd}$ BG), the current standing wave does not have a complete node. It is the factor that causes the upper limit frequency of the second band gap ($2^{nd}$ BG) to be lowered as the value of the added inductance increases. Therefore, in the second band gap ($2^{nd}$ BG), the effect of extending the electrical length of the first transmission line 104 obtained based on the inductance 304 which is added by the slit 105, not only at the lower limit of the second band gap ($2^{nd}$ BG), but also at the upper limit frequency of the second band gap ($2^{nd}$ BG) is seen.

Modified Examples of First Example Embodiment

Next, modified examples of the first example embodiment will be described.

First Modified Example of First Example Embodiment

Figure 6:
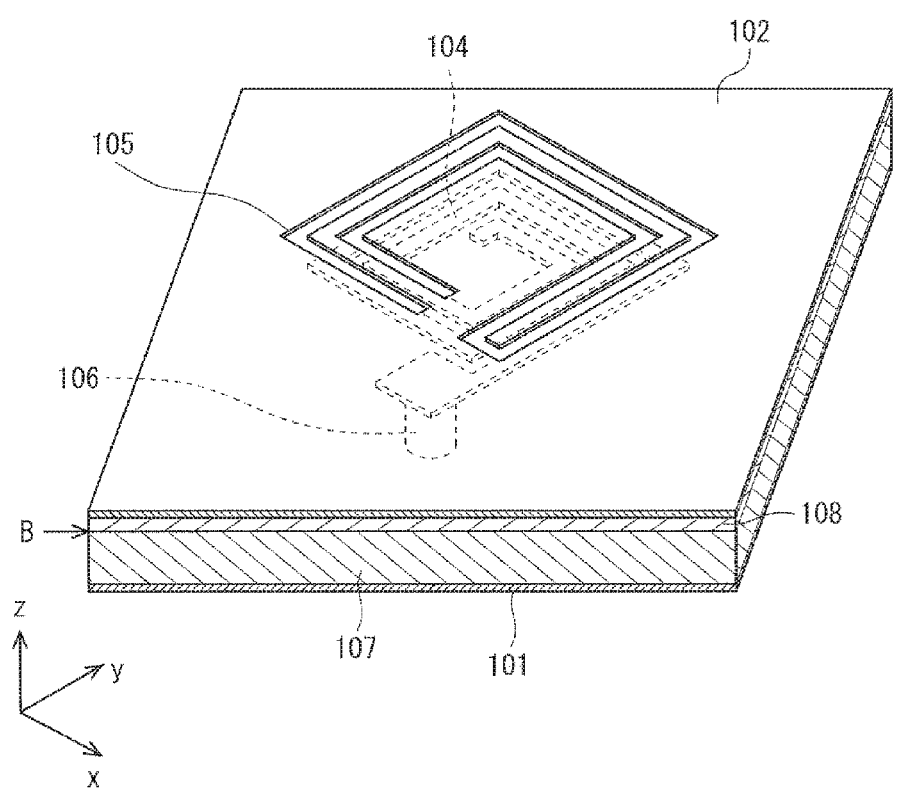
FIG. 6 is a perspective view showing an appearance of a structure according to a first modified example of the first example embodiment of the present invention.

First, a modified example related to the arrangement and shape of the first transmission line 104 will be described as a first modified example. The arrangement and shape of the first transmission line 104 may be arbitrarily determined, as long as one end of the first transmission line is an open end and the other end of the first transmission line is connected with the conductor via 106. FIGS. 1, 2, and 3 in the first example embodiment described above illustrate a case where the first transmission line 104 has a linear shape. However, for example, the first transmission line may have a spiral shape as shown in FIG. 6, a meander shape, or a random shape. When the first transmission line 104 has a modified shape as mentioned above, it is desirable to change the shape of the slit 105 according to the shape of the first transmission line 104. For example, when the first transmission line 104 has a spiral shape as shown in FIG. 6, the slit 105 desirably has a spiral shape. When the first transmission line 104 has a spiral shape, the conductor via 106 is desirably disposed at the outer periphery of the first transmission line 104 having a spiral shape as shown in FIG. 6.

Figure 7:
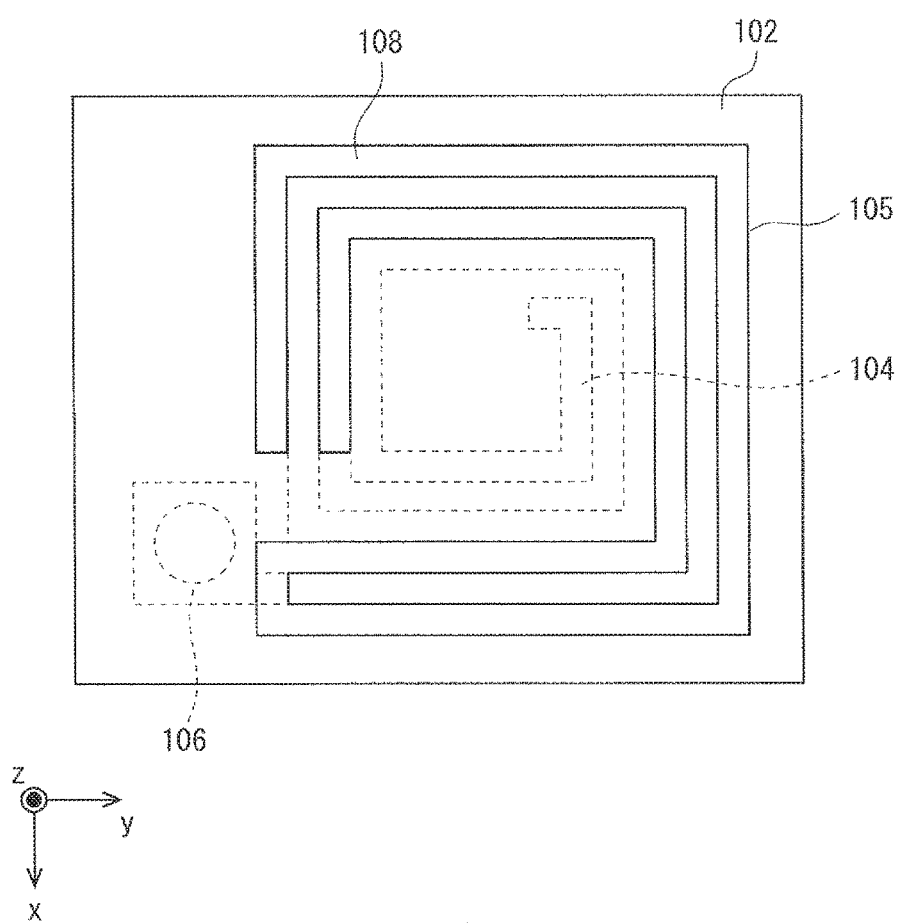
FIG. 7 is a top view showing an example of an upper surface of the structure shown in FIG. 6.
Figure 8:
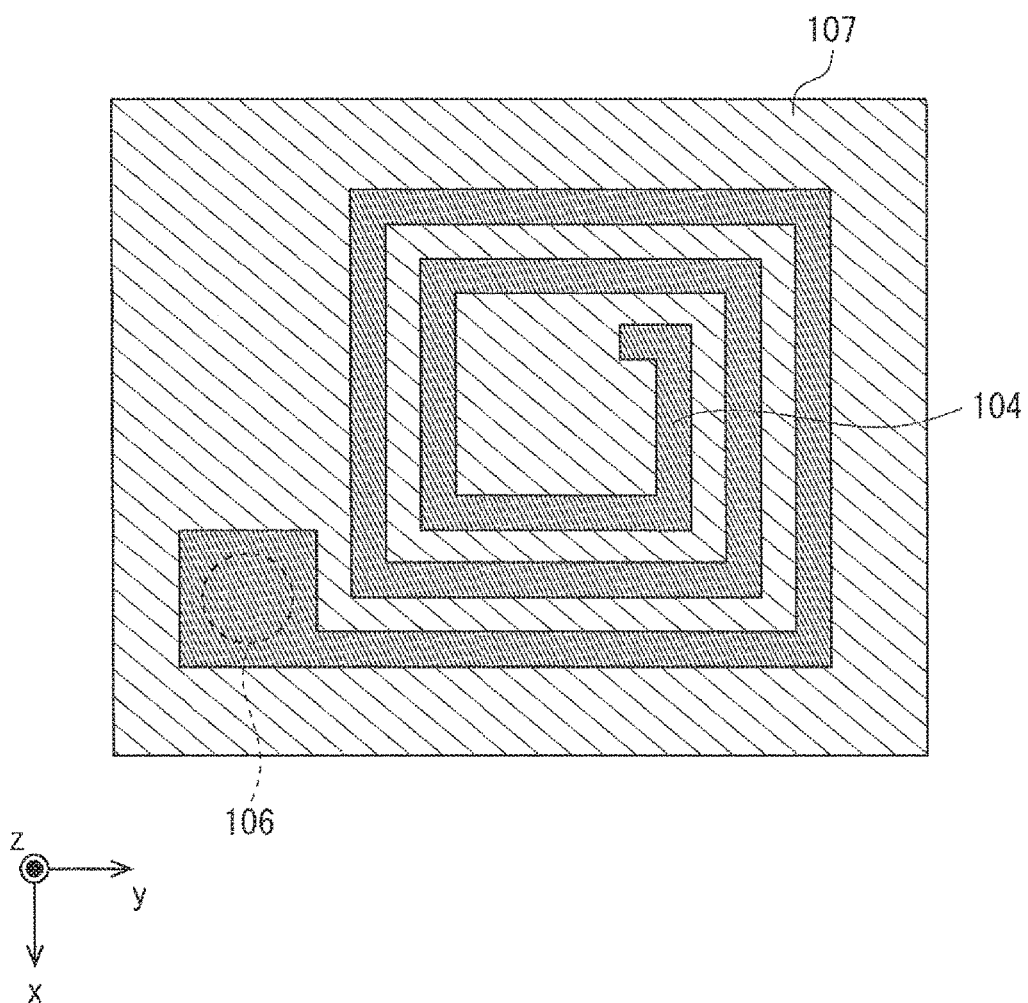
FIG. 8 is a sectional view showing an example of a sectional structure of the structure shown in FIG. 6.

FIG. 6 is a perspective view showing the appearance of the structure according to the first modified example of the first example embodiment of the present invention, and illustrates an example in which the first transmission line 104 and the slit 105 each have a spiral shape. FIG. 7 is a top view showing an example of an upper surface of the structure shown in FIG. 6. FIG. 8 is a sectional view showing an example of a sectional structure of the structure shown in FIG. 6, and illustrates an xy section at a location indicated by "A" in FIG. 6. Specifically, as shown in FIGS. 6 and 7, the slit 105 has a spiral shape corresponding to the spiral shape of the first transmission line 104. Thus, the formation of the first transmission line 104 with a spiral shape as shown in FIGS. 6 and 7, or a meander shape makes it possible to ensure the transmission line length with a small mounting area and to effectively arrange the EBG structure in a small area. The formation of the first transmission line 104 with a random shape makes it possible to route the first transmission line 104 while avoiding other structures, and to efficiently arrange the EBG structure in a limited region.

Figure 9:
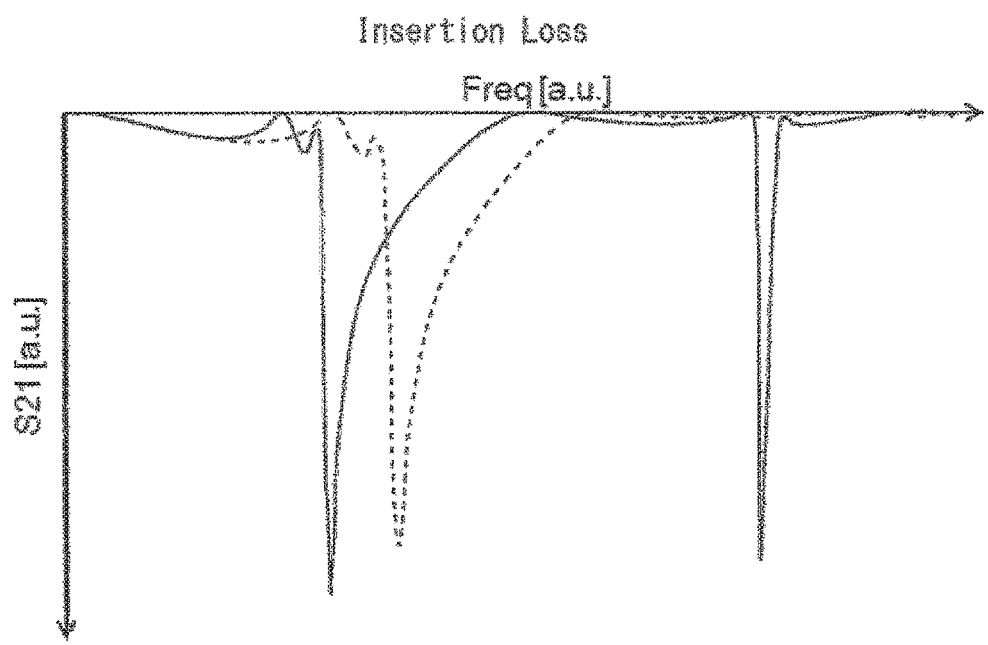
FIG. 9 is a characteristic diagram showing an example of electromagnetic field analysis results showing an effect of the first modified example of the first example embodiment of the present invention.

FIG. 9 is a characteristic diagram showing an example of electromagnetic field analysis results showing the effect of the first modified example of the first example embodiment according to the present invention. In FIG. 9, the horizontal axis represents a frequency and the vertical axis represents a propagation characteristic $S_{21}$ (insertion loss). A solid-line graph FIG. 9 indicates the propagation characteristic $S_{21}$ of the parallel flat line in which five structures shown in FIG. 6, 7, or 8 are arranged in tandem, and a dashed-line graph in FIG. 9 indicates the propagation characteristic $S_{21}$ of the parallel flat line in which five structures obtained by removing only the slits 105 from the structures shown in FIG. 6, 7, or 8 are arranged in tandem.

As is seen from FIG. 9, due to the effect of the slit 105, a first band gap ($1^{st}$ BG) frequency (a frequency defined as a frequency having a minimum pass characteristic, i.e., a minimum propagation characteristic $S_{21}$) is shifted to a lower frequency side. This indicates that a reduction in the band gap frequency is achieved without extending the length of the transmission line, and also indicates that a reduction in the length of the transmission line, i.e., miniaturization of the structure, can be achieved.

Second Modified Example of First Example Embodiment

Figure 10:
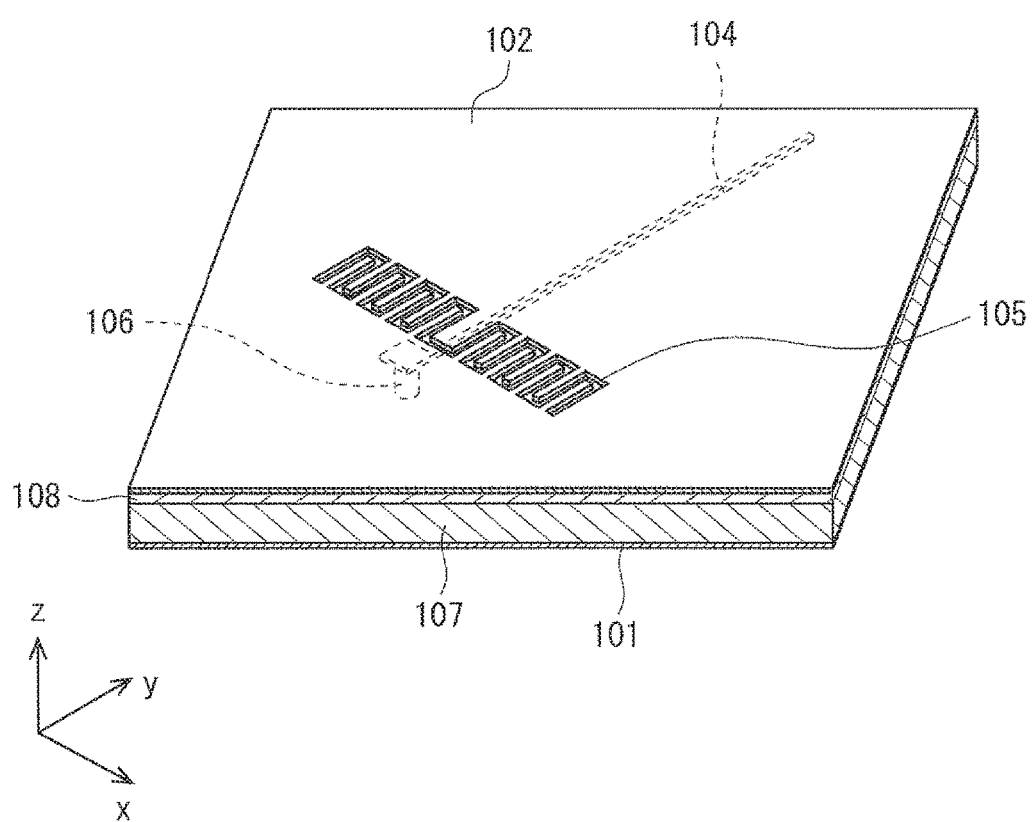
FIG. 10 is a perspective view showing an appearance of a structure according to a second modified example of the first example embodiment of the present invention.

Next, a modified example related to the arrangement and shape of each slit 105 will be described as a second modified example. The arrangement and shape of each slit 105 may be arbitrarily determined, as long as the slit 105 stretches to the both sides of the first transmission line 104 in the x-axis direction from the starting point where the slit 105 overlaps the first transmission line 104 in the z-axis direction (thickness direction). FIGS. 1, 2, and 3 in the first example embodiment described above illustrate a case where the slit 105 has a linear shape. However, for example, the slit 105 may have a meander shape as shown in FIG. 10, a spiral shape, or a random shape. Further, the slit 105 may be arranged so as to intersect with the first transmission line 104 a plurality of times.

Figure 14:
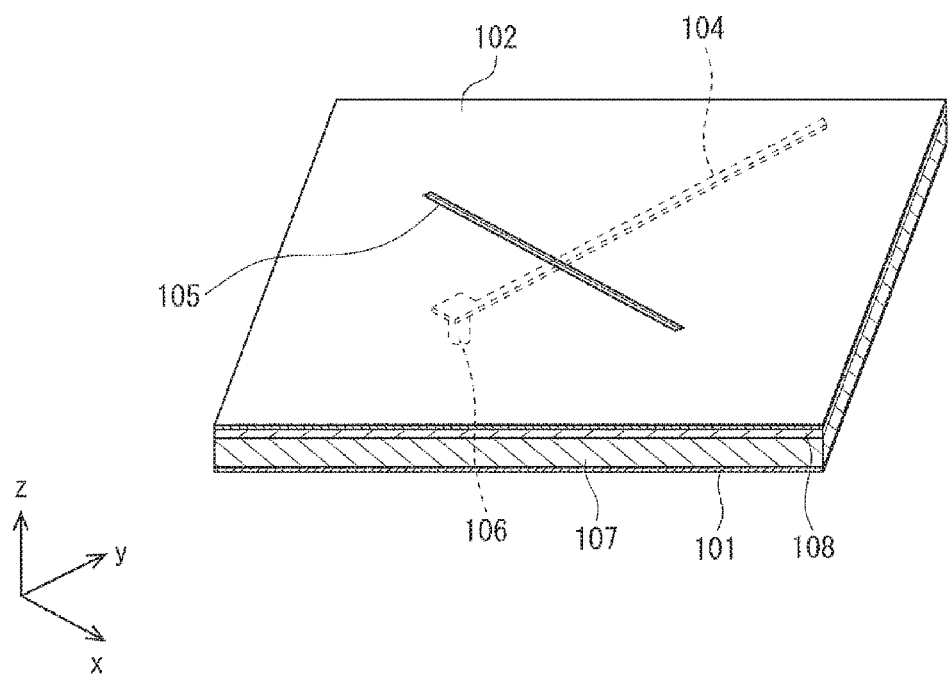
FIG. 14 is a perspective view showing an example in which a slit of the structure shown in FIG. 1 as the first example embodiment according to the present invention overlaps a transmission line at a location different from that shown in FIG. 1.

The location where the slit 105 overlaps the first transmission line 104 in the z-axis direction need not necessarily be located in the vicinity of a node between the first transmission line 104 and the conductor via 106. As shown in FIG. 14, the location may be apart from the vicinity of the node between the first transmission line 104 and the conductor via 106. FIG. 14 is a perspective view showing an example in which the slit 105 of the structure shown in FIG. 1 as the first example embodiment according to the present invention overlaps the first transmission line 104 at a location different from that shown in FIG. 1.

Figure 15:
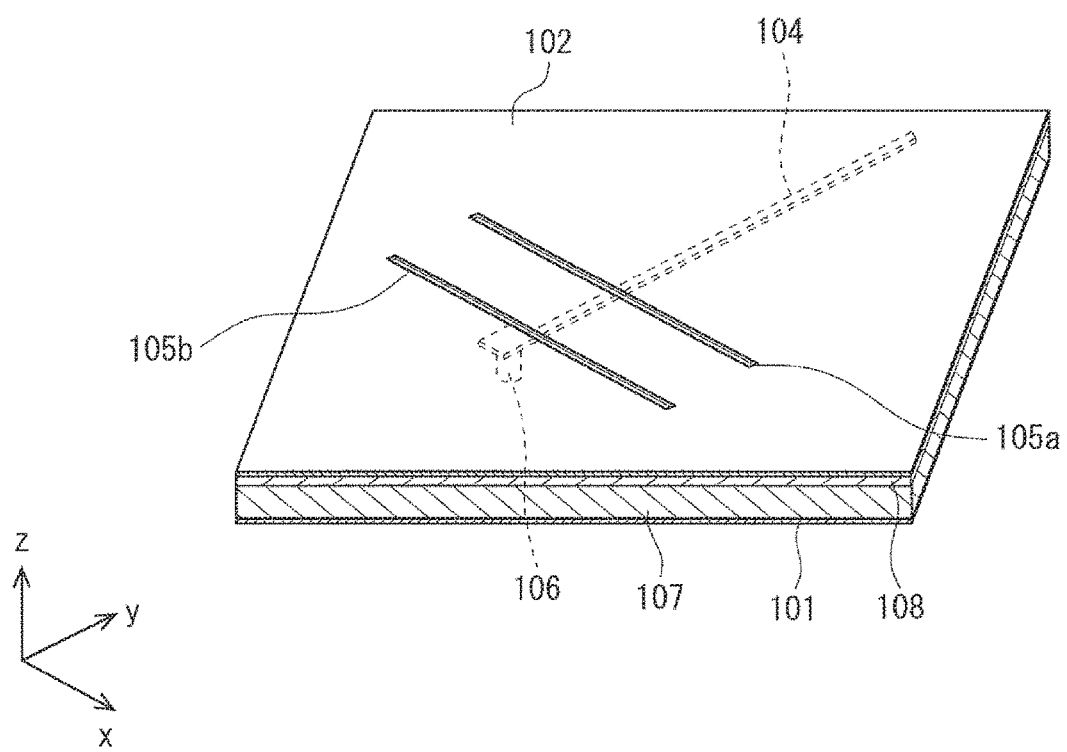
FIG. 15 is a perspective view showing an example in which a plurality of slits of the structure shown in FIG. 1 as the first example embodiment according to the present invention are arranged.

The number of the slits 105 need not necessarily be one. For example, as shown in FIG. 15, a plurality of slits 105a and 105b may be arranged for the same first transmission line 104. FIG. 15 is a perspective view showing an example in which a plurality of slits 105 of the structure shown in FIG. 1 as the first example embodiment according to the present invention are arranged. In the case of FIG. 15, the plurality of slits 105a and 105b each function as an inductance added to the first transmission line 104. It can be expected that, when the slit 105b is provided in addition to the slit 105a, the effect of lowering the band gap frequency can be increased as compared with a case where only the slit 105a is formed.

The example described above illustrates a case where two slits 105 are formed. However, the number of the slits is not limited to two, but instead three, four, or more slits 105 may be arranged.

Figure 11:
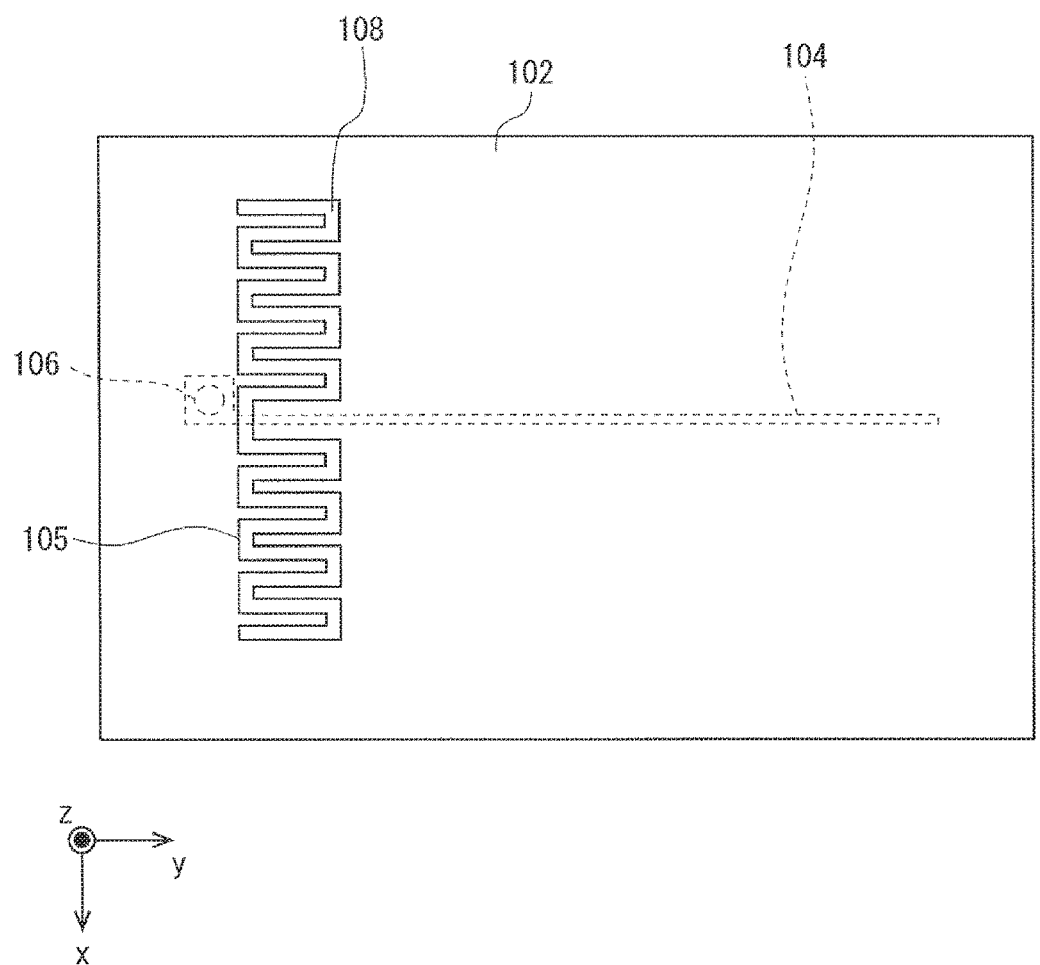
FIG. 11 is a top view showing an example of an upper surface of the structure shown in FIG. 10.

FIG. 10 is a perspective view showing the appearance of the structure according to the second modified example of the first example embodiment of the present invention, and illustrates an example in which the slit 105 has a meander shape. FIG. 11 is a top view showing an example of one surface (upper surface) of the structure shown in FIG. 10. Note that FIGS. 10 and 11 in the second modified example illustrate a case where the first transmission line 104 has a linear shape, like in the case of FIGS. 1, 2, and 3 described above.

Third Modified Example of First Example Embodiment

Figure 12:
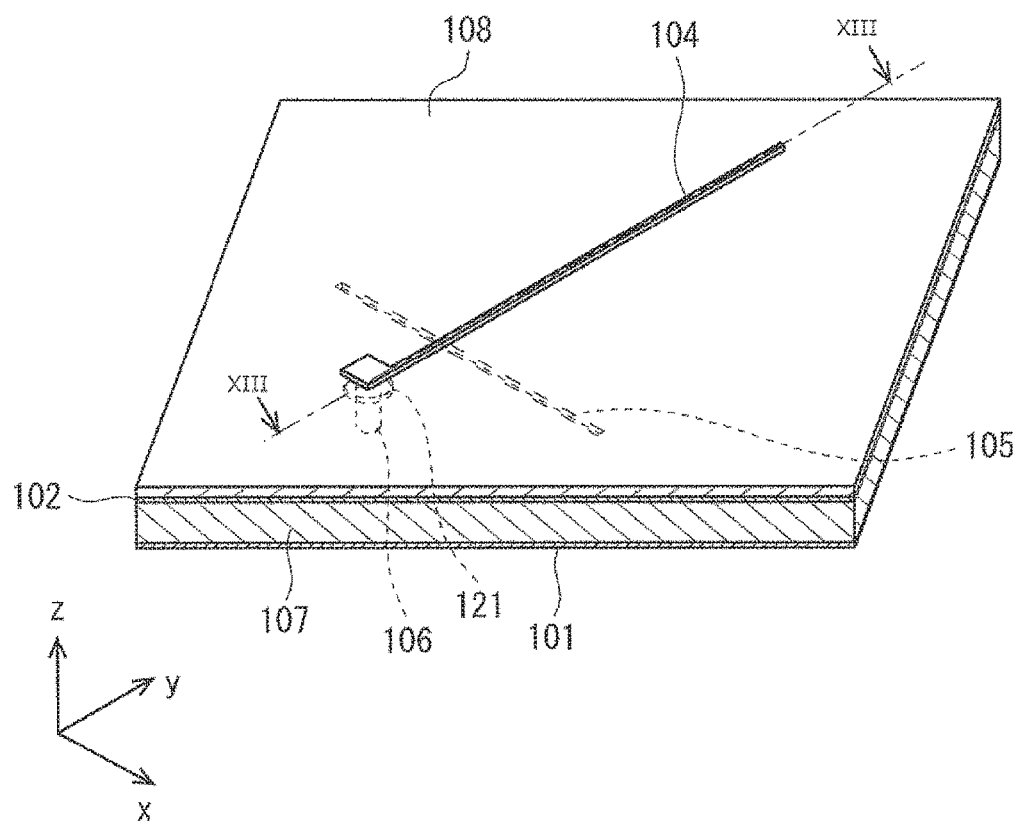
FIG. 12 is a perspective view showing an appearance of a structure according to a third modified example of the first example embodiment of the present invention.

Next, a modified example related to the arrangement of the first transmission line 104 will be described as a third modified example. FIGS. 1, 2, and 3 in the first first example embodiment described above illustrate a case where the first transmission line 104 is disposed on the other side (lower surface side) of the second conductor plane 102, i.e., between the first conductor plane 101 and the second conductor plane 102. However, for example, as shown in FIG. 12, the first transmission line 104 may be provided on one side (upper surface side) of the second conductor plane 102. In this case, however, when the first transmission line 104 is disposed on one side (upper surface side) of the second conductor plane 102, it is necessary to arrange a clearance 121 on the second conductor plane 102 so as to separate, in a direct current way, the second conductor plane 102 which is interposed at an intermediate part and the conductor via 106.

Figure 13:
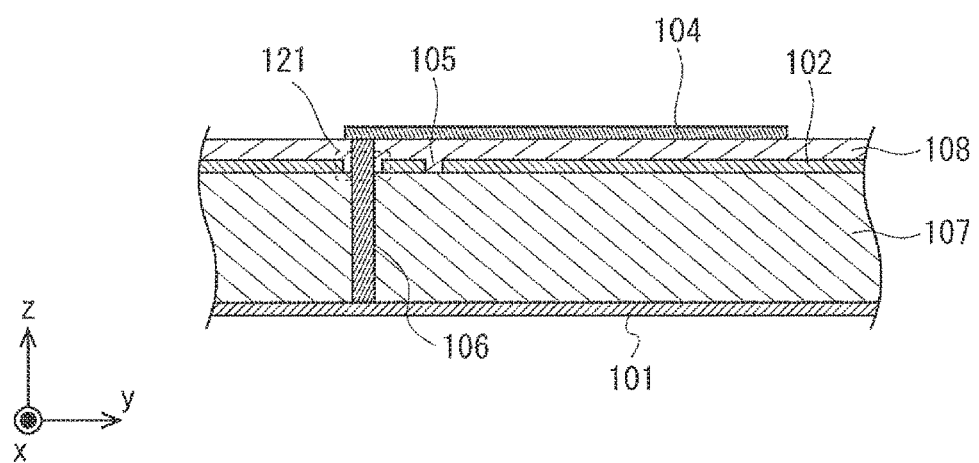
FIG. 13 is a sectional view showing an example of a sectional structure of the structure shown in FIG. 12.

FIG. 12 is a perspective view showing the appearance of the structure according to the third modified example of the first example embodiment of the present invention, and illustrates an example in which the first transmission line 104 is provided not on the other side (lower surface side) of the conductor plane 102, but on one side (upper surface side) of the conductor plane 102. FIG. 13 is a sectional view showing an example of a sectional structure of the structure shown in FIG. 12. The sectional view of FIG. 13 illustrates a section taken along a line XIII-XIII shown in FIG. 12.

The structure will be described in more detail below. The EBG structure shown in FIGS. 12 and 13 includes the first dielectric layer 107, which is similar to that of the EBG structure shown in FIGS. 1 and 2, between the first transmission line 104 and the first conductor plane 101, and the second dielectric layer 108 stacked on one side (upper surface side) of the first dielectric layer 107 in the thickness direction. The first conductor plane 101 is disposed on the other side (lower surface side) of the first dielectric layer 107 in the thickness direction, like in the EBG structure shown in FIGS. 1 and 2. However, the second conductor plane 102 is disposed between one side (upper surface side) of the first dielectric layer 107 and the other side (lower surface side) of the second dielectric layer 108, unlike in the EBG structure shown in FIGS. 1 and 2 in which the second conductor plane 102 is disposed on one side of the (upper surface side) of the second dielectric layer 108.

Further, the first transmission line 104 is disposed on one side (upper surface side) of the second dielectric layer in the thickness direction (z-axis direction) of the second dielectric layer 108, unlike in the EBG structure shown in FIGS. 1 and 2 in which the first transmission line 104 is formed between the first conductor plane 101 and the second conductor plane 102. However, like in the EBG structure shown in FIGS. 1 and 2, the first transmission line 104 faces the second conductor plane 102 and stretches in the y-axis direction shown in FIG. 12. Further, one end of the first transmission line 104 is an open end (open end), and the other end thereof is connected with the first conductor plane 101 through the conductor via 106. Furthermore, the first transmission line 104 functions as an open stub.

Like in the EBG structure shown in FIGS. 1 and 2, the slit 105 is provided on the second conductor plane 102, and stretches to the both sides of the first transmission line 104 in the x-axis direction, which is perpendicular to the y-axis direction of the first transmission line 104, from the starting point where the slit overlaps the other end of the first transmission line 104 in the z-axis direction (thickness direction). Like in the EBG structure shown in FIGS. 1 and 2, the conductor via 106 stretches in the z-axis direction (thickness direction) so as to connect the other end of the first transmission line 104 to the first conductor plane 101, and extends from the upper surface of the second dielectric layer 108 to the lower surface of the first dielectric layer 107. However, in the EBG structure shown in FIGS. 12 and 13, the second conductor plane 102 is disposed between one side (upper surface side) of the first dielectric layer 107 and the other side (lower surface side) of the second dielectric layer 108. Accordingly, in order to prevent the conductor via 106 and the second conductor plane 102 from being short-circuited in a direct current way, it is necessary to provide the clearance 121 as shown in FIG. 13 at the location of the second conductor plane 102 through which the conductor via 106 passes.

The first example embodiment described above illustrates a case where, as shown in FIGS. 1 to 3, no material is formed on the upper surface of the second conductor plane 102 and on the lower surface of the first conductor plane 101. However, any material may be formed on the upper surface of the second conductor plane and on the lower surface of the first conductor plane. For example, it is assumed that a dielectric or a metallic pattern may be further formed so as to increase the effective dielectric constant of the first transmission line 104, or prevent radiation of unnecessary electromagnetic waves from the first transmission line 104. The first to third modified examples shown in FIGS. 6 to 13 also illustrate a case where no material is formed on the upper surface of the first transmission line 104 and on the lower surface of the first conductor plane 101. However, any material may be formed on the upper surface of the first transmission line and on the lower surface of the first conductor plane. For example, it is assumed that a dielectric or a metallic pattern may be further disposed.

Fourth Modified Example of First Example Embodiment

Figure 16:
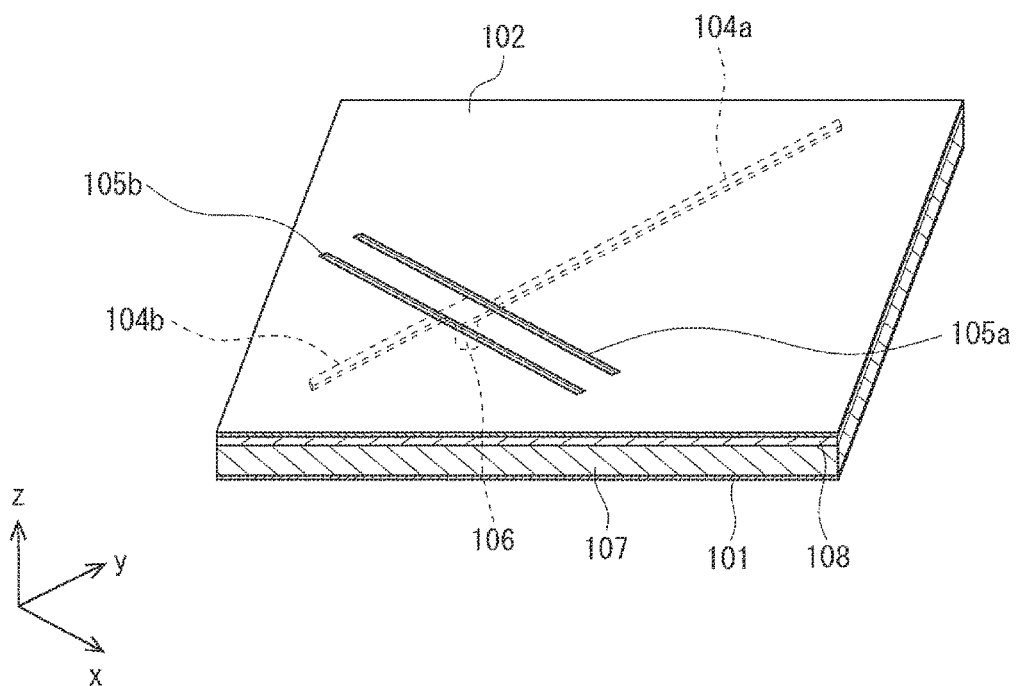
FIG. 16 is a perspective view showing an appearance of a structure according to a fourth modified example of the first example embodiment of the present invention.

Next, a modified example of the first transmission line 104 will be described as a fourth modified example. In the fourth modified example, two transmission lines, i.e., a first transmission line 104a and a second transmission line 104b, are present as the first transmission line 104. One end of the first transmission line 104a and one end of the second transmission line 104b are connected with the first conductor plane 101 by the same first conductor via 106. FIG. 16 is a perspective view showing the appearance of the structure according to the fourth modified example of the first example embodiment of the present invention, and illustrates an example in which two transmission lines, i.e., the first transmission line 104a and the second transmission line 104b, are present as the first transmission line 104.

In the example shown in FIG. 16, the first transmission line 104a and the second transmission line 104b are arranged so as to stretch in opposite direction along the y-axis. In this case, the slit 105a is disposed for the first transmission line 104a. On the other hand, the slit 105b is disposed for the second transmission line 104b.

Figure 17:
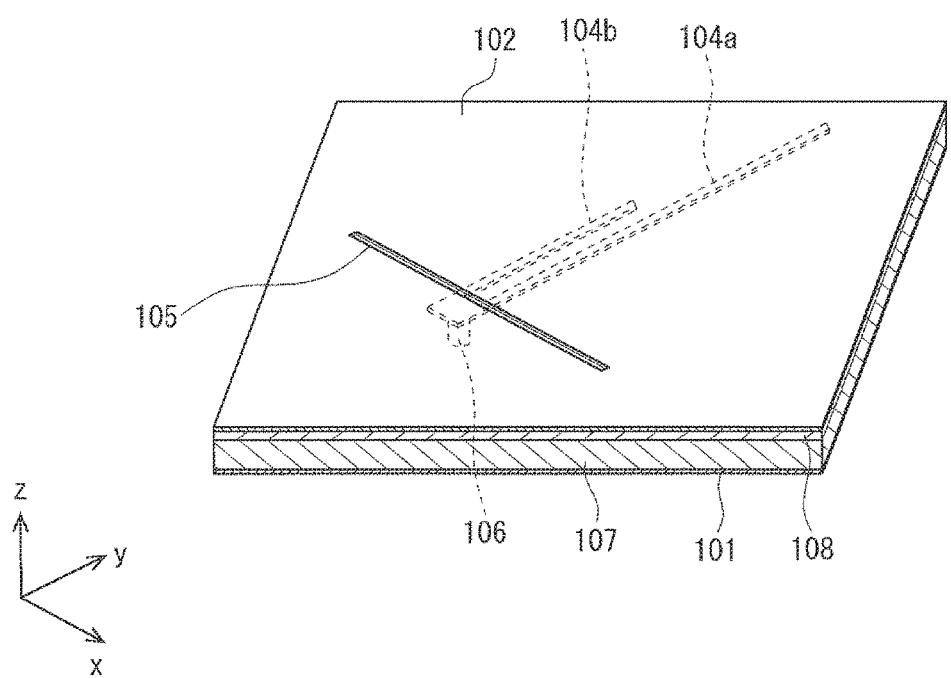
FIG. 17 is a perspective view showing an appearance of an arrangement example different from that shown in FIG. 16 of the structure according to the fourth modified example of the first example embodiment of the present invention.

In the example shown in FIG. 17, the first transmission line 104a and the first transmission line 104b are arranged so as to stretch in the same direction along the y-axis, and an inductance is added to each of the first transmission line 104a and the first transmission line 104b by the same slit 105. FIG. 17 is a perspective view showing the appearance of an arrangement example different from that shown in FIG. 16 of the structure according to the fourth modified example of the first example embodiment of the present invention, and illustrates an example in which two transmission lines, i.e., the first transmission line 104a and the second transmission line 104b, are present as the first transmission line 104 in the same direction along the y-axis.

Figure 18:
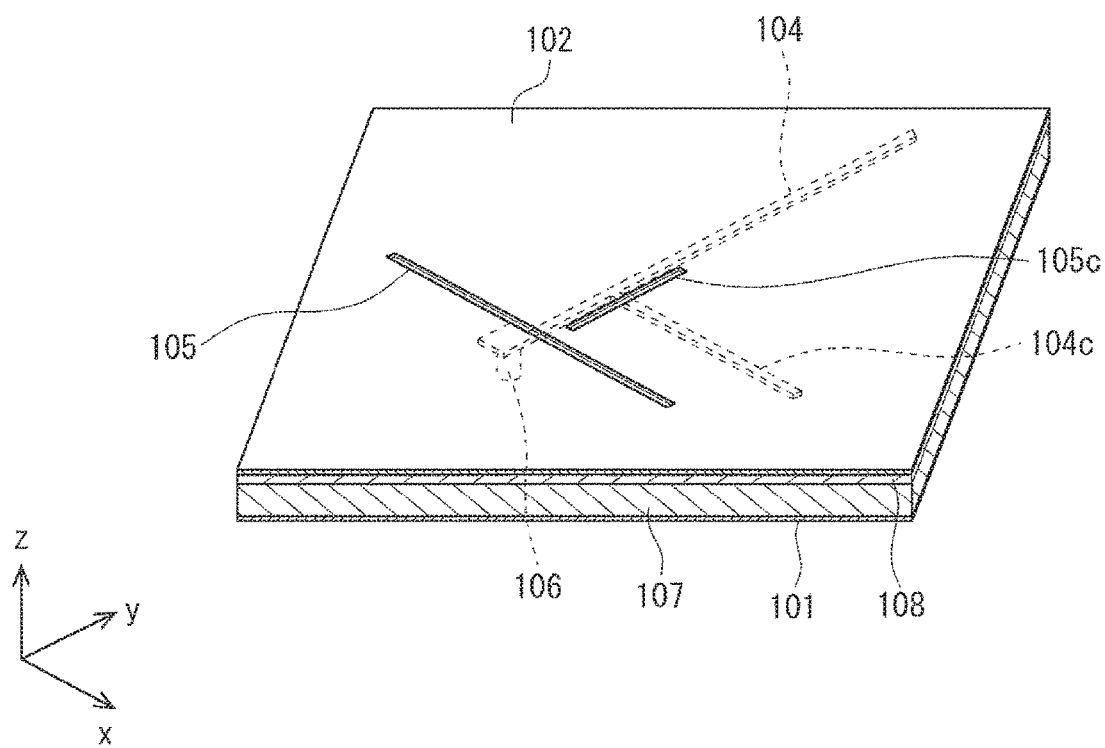
FIG. 18 is a perspective view showing an appearance of another arrangement example different from that shown in FIGS. 16 and 17 of the structure according to the fourth modified example of the first example embodiment of the present invention.

It is also possible to employ a configuration in which the first transmission line 104 is branched at an intermediate part. In the example shown in FIG. 18, the first transmission line 104, which is the main line, includes a branch line 104c which is branched from the first transmission line. FIG. 18 is a perspective view showing the appearance of another arrangement example different from that shown in FIGS. 16 and 17 of the structure according to the fourth modified example of the first example embodiment of the present invention, and illustrates an example in which the first transmission line 104 is branched at an intermediate part. The branch line 104c enables adjustment of the interval between the first band gap and the second band gap depending on the location where the branch line is branched from the first transmission line 104, and adjustment of the width of the first band gap and the width of the second band gap. In the example shown in FIG. 18, an inductance is added to the first transmission line 104, which is the main line, by the slit 105, while an inductance is added to the first transmission line side of the branch line 104c by the slit 105c.

An example in which two first transmission lines 104 are provided and an example in which the first transmission line 104 is branched into two lines have been described above. However, the number of the first transmission lines is not limited to two, but instead three, four, or more first transmission lines may be provided.

Configurations of preferred example embodiments of the present invention have been described above. However, it should be noted that the example embodiments are merely examples of the present invention and are not intended to limit the present invention. A person skilled in the art can easily understand that the present invention can be modified or altered in various ways according to specific applications without departing from the scope of the invention.

This application is based upon and claims the benefit of priority from Japanese patent application No. 2015-025091, filed on Feb. 12, 2015, the disclosure of which is incorporated herein in its entirety by reference.

REFERENCE SIGNS LIST

101 FIRST CONDUCTOR PLANE (FIRST CONDUCTOR)
102 SECOND CONDUCTOR PLANE (SECOND CONDUCTOR)
103 UNIT STRUCTURE
104 FIRST TRANSMISSION LINE
104a FIRST TRANSMISSION LINE
104b SECOND TRANSMISSION LINE
104c BRANCH LINE
105 SLIT (INDUCTANCE IMPARTING MEMBER)
105a SLIT
105b SLIT
105c SLIT
106 CONDUCTOR VIA (FIRST CONDUCTOR VIA)
107 FIRST DIELECTRIC
108 SECOND DIELECTRIC
121 CLEARANCE
301 REPETITION UNIT
302 PARALLEL FLAT LINE
303 TRANSMISSION LINE
304 INDUCTANCE (INDUCTANCE BY SLIT 105)
305 INDUCTANCE (INDUCTANCE BY CONDUCTOR VIA 106)

The invention claimed is:
1. A structure comprising:
a first conductor plane;
a second conductor plane that faces the first conductor plane;
a first transmission line that is formed in a layer different from the first conductor plane and the second conductor plane and faces the second conductor plane, one end of the first transmission line being an open end;
a conductor via that connects another end of the first transmission line with the first conductor plane; and
a slit that is formed on the second conductor plane and stretches to both sides of the first transmission line from a starting point where the slit overlaps the first transmission line in a plan view.
2. The structure according to claim 1, wherein the first conductor plane, the second conductor plane, the first transmission line, the conductor via, and the slit constitute an EBG (Electromagnetic Band Gap) structure.

3. The structure according to claim 1, wherein a slit length of the slit is twice or more as long as a transmission line length of the first transmission line.

4. The structure according to claim 1, wherein when the slit length of the slit is represented by L, the slit overlaps the first transmission line in a plan view at least at a location where (L/2−L/4) or more and (L/2+L/4) or less from a slit end of the slit are satisfied.

5. The structure according to claim 1, wherein when the transmission line length of the first transmission line is represented by D, the first transmission line overlaps the slit in a plan view at least at a location within a range of (D/8) or less from a node between the first transmission line and the conductor via.

6. The structure according to claim 1, wherein a distance between the second conductor plane and the first transmission line is equal to or less than a half (½) of a distance between the first conductor plane and the first transmission line.

7. The structure according to claim 1, wherein the first transmission line has a spiral shape.

8. The structure according to claim 7, wherein the conductor via is located at an outer periphery of the first transmission line having the spiral shape.

9. A wiring substrate comprising:
a first conductor plane;
a second conductor plane that faces the first conductor plane;
a first transmission line that is formed in a layer different from the first conductor plane and the second conductor plane and faces the second conductor plane, one end of the first transmission line being an open end;
a conductor via that connects another end of the first transmission line with the first conductor plane; and
a slit that is formed on the second conductor plane and stretches to both sides of the first transmission line from a starting point where the slit overlaps the first transmission line in a plan view.

10. The wiring substrate according to claim 9, wherein the first conductor plane, the second conductor plane, the first transmission line, the conductor via, and the slit constitute an EBG (Electromagnetic Band Gap) structure.

* * * * *